(12) United States Patent
Park et al.

(10) Patent No.: US 9,117,975 B2
(45) Date of Patent: Aug. 25, 2015

(54) LIGHT EMITTING DEVICE HAVING AN ANTI-CRACK LAYER

(71) Applicant: LG INNOTEK CO., LTD., Seoul (KR)

(72) Inventors: BumDoo Park, Seoul (KR); SonKyo Hwan, Seoul (KR); TaeJin Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/167,794

(22) Filed: Jan. 29, 2014

(65) Prior Publication Data

US 2014/0209958 A1    Jul. 31, 2014

(30) Foreign Application Priority Data

Jan. 30, 2013  (KR) .................. 10-2013-0010618

(51) Int. Cl.
| | |
|---|---|
| H01L 33/00 | (2010.01) |
| H01L 21/00 | (2006.01) |
| H01L 33/44 | (2010.01) |
| H01L 33/36 | (2010.01) |
| H01L 33/62 | (2010.01) |
| H01L 33/48 | (2010.01) |
| H01L 33/60 | (2010.01) |
| H01L 33/40 | (2010.01) |
| H01L 51/56 | (2006.01) |
| H01L 33/38 | (2010.01) |
| H01L 33/42 | (2010.01) |

(52) U.S. Cl.
CPC ............... *H01L 33/44* (2013.01); *H01L 33/36* (2013.01); *H01L 33/40* (2013.01); *H01L 33/486* (2013.01); *H01L 33/60* (2013.01); *H01L 33/62* (2013.01); *H01L 33/387* (2013.01); *H01L 33/42* (2013.01); *H01L 51/56* (2013.01); *H01L 2224/48091* (2013.01)

(58) Field of Classification Search
CPC ......... H01L 33/40; H01L 33/44; H01L 33/62; H01L 33/36; H01L 33/387; H01L 33/42; H01L 2924/3512; H01L 33/486; H01L 33/60; H01L 51/56
See application file for complete search history.

(56) References Cited

U.S. PATENT DOCUMENTS

| | | | | |
|---|---|---|---|---|
| 5,006,907 | A * | 4/1991 | Hayakawa | 372/45.013 |
| 6,242,761 | B1 * | 6/2001 | Fujimoto et al. | 257/94 |
| 7,956,376 | B2 * | 6/2011 | Jeong | 257/98 |
| 8,232,577 | B2 * | 7/2012 | Jeong | 257/99 |
| 8,426,883 | B2 * | 4/2013 | Park et al. | 257/98 |
| 8,866,173 | B2 * | 10/2014 | Jeong | 257/98 |
| 2004/0075102 | A1 * | 4/2004 | Chen et al. | 257/103 |
| 2010/0117109 | A1 * | 5/2010 | Unno | 257/98 |
| 2010/0200884 | A1 * | 8/2010 | Lee et al. | 257/98 |
| 2011/0156077 | A1 * | 6/2011 | Lee et al. | 257/98 |

\* cited by examiner

*Primary Examiner* — Alonzo Chambliss

(74) *Attorney, Agent, or Firm* — Birch, Stewart, Kolasch & Birch, LLP

(57) ABSTRACT

Disclosed is a light emitting device including a conductive substrate, a first electrode layer disposed on the conductive substrate, a light emitting structure disposed on the first electrode layer, the light emitting structure including a first semiconductor layer, a second semiconductor layer, and an active layer disposed between the first semiconductor layer and the second semiconductor layer, a second electrode layer electrically connected to the second semiconductor layer, and an anti-crack layer disposed on a boundary on which the light emitting structure is segmented on a chip basis, wherein the anti-crack layer is disposed under the light emitting structure and includes a metal material contacting the light emitting structure.

19 Claims, 15 Drawing Sheets

LIGHT EMITTING DEVICE HAVING AN ANTI-CRACK LAYER

CROSS-REFERENCE TO RELATED APPLICATION

This application claims the priority benefit of Korean Patent Application No. 10-2013-0010618, filed on Jan. 30, 2013 in the Korean Intellectual Property Office, the disclosure of which is incorporated herein by reference.

BACKGROUND

1. Field

Embodiments relate to a light emitting device.

2. Description of the Related Art

A light emitting diode (LED) as a representative example of a light emitting device is a device which converts electrical signals into infrared light, visible light or light using characteristics of compound semiconductors. LEDs are now being applied to devices such as home appliances, remote controls, electronic signboards, displays, a variety of automatic appliances and the like and applications thereof continue to expand.

Generally, a miniaturized LED is fabricated as a surface mount device so as to be directly mounted to a printed circuit board (PCB). Accordingly, an LED lamp used as a display device is also developed as a surface mount device. Such a surface mount device may replace conventional simple luminaires and is used in lighting displays, character displays, image displays and the like, rendering various colors.

As the application range of LEDs extends, luminance required for lights for daily use and lights for distress signals increases. Accordingly, it is important to increase luminance of LEDs.

In addition, electrodes of light emitting devices should have superior adhesion and electrical properties.

In addition, research to improve luminance of light emitting devices and reduce operating voltage is underway. In addition, cracks may be disadvantageously generated when a wafer is cut on a light emitting device basis.

SUMMARY

Embodiments provide a light emitting device which reduces forward voltage (VF), improves luminous efficacy and prevents cracks when cut on a chip basis.

In one embodiment, a light emitting device includes a conductive substrate, a first electrode layer disposed on the conductive substrate, a light emitting structure disposed on the first electrode layer, the light emitting structure including a first semiconductor layer, a second semiconductor layer, and an active layer disposed between the first semiconductor layer and the second semiconductor layer, a second electrode layer electrically connected to the second semiconductor layer, and an anti-crack layer disposed on a boundary on which the light emitting structure is segmented on a chip basis, wherein the anti-crack layer is disposed under the light emitting structure and includes a metal material contacting the light emitting structure.

The anti-crack layer may form a closed area.

The anti-crack layer may be disposed on the circumference of the light emitting structure.

The anti-crack layer may have a width of 30 μm to 70 μm.

The anti-crack layer may include at least one of Au, Be and an Au alloy.

The anti-crack layer may have a multilayer structure.

The anti-crack layer may be flush with the first electrode layer.

The light emitting device may further include a window layer disposed between the first electrode layer and the first semiconductor layer to reduce a reflectivity difference therebetween, wherein the anti-crack layer contacts a lower part of the window layer.

The window layer may include GaP, GaAsP or AlGaAs.

An area in which the window layer contacts the anti-crack layer may be doped with a dopant having the same polarity as the first semiconductor layer.

The first electrode layer may include a transparent electrode layer disposed between the conductive substrate and the first semiconductor layer, and an ohmic layer including a plurality of metal contact portions passing through the transparent electrode layer, wherein each metal contact portion includes AuBe.

A planar area of the transparent electrode layer may be greater than a planar area of the metal contact portion.

The planar area of the metal contact portion may be 10% to 25% with respect to the planar area of the transparent electrode layer.

A surface of the metal contact portion may contact the first semiconductor layer.

The light emitting structure may include AlGaInP or GaInP.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
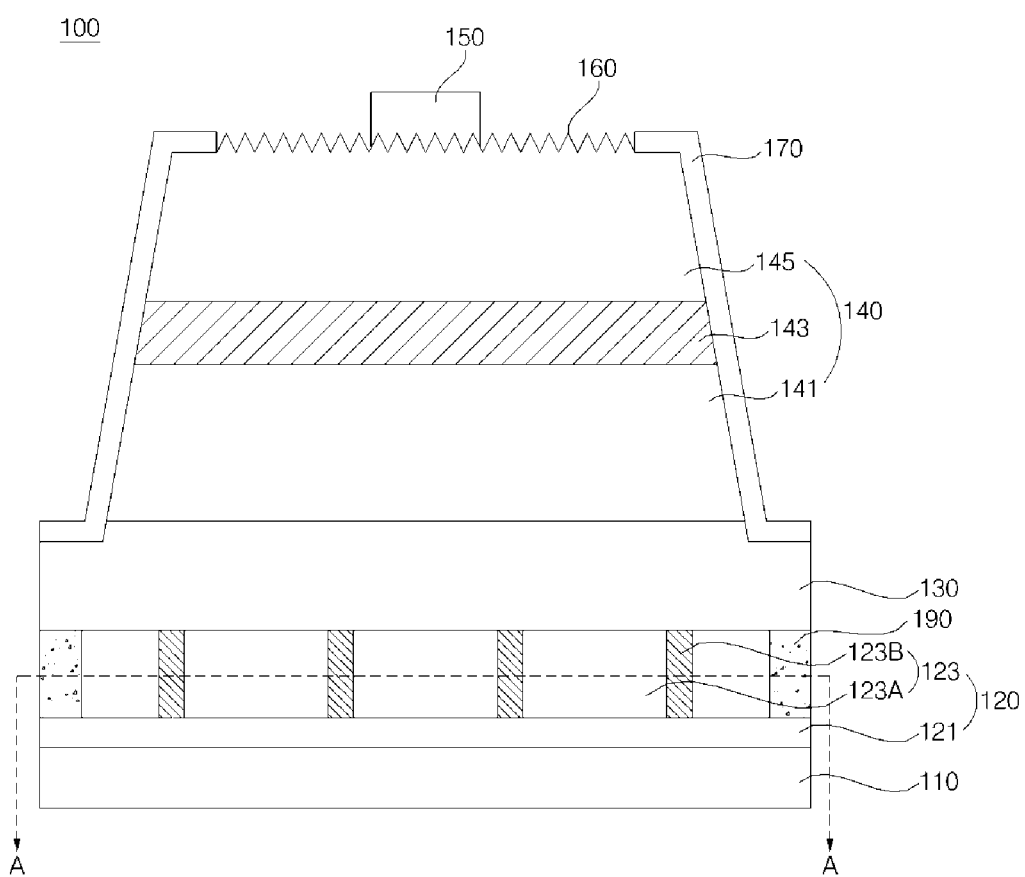
FIG. 1 is a sectional view illustrating a light emitting device according to an embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially relative terms such as "below", "beneath", "lower", "above", or "upper" may be used herein to describe one element's relationship to another element as illustrated in the figures. It will be understood that spatially relative terms are intended to encompass different orientations of the device in addition to the orientation depicted in the figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 2:
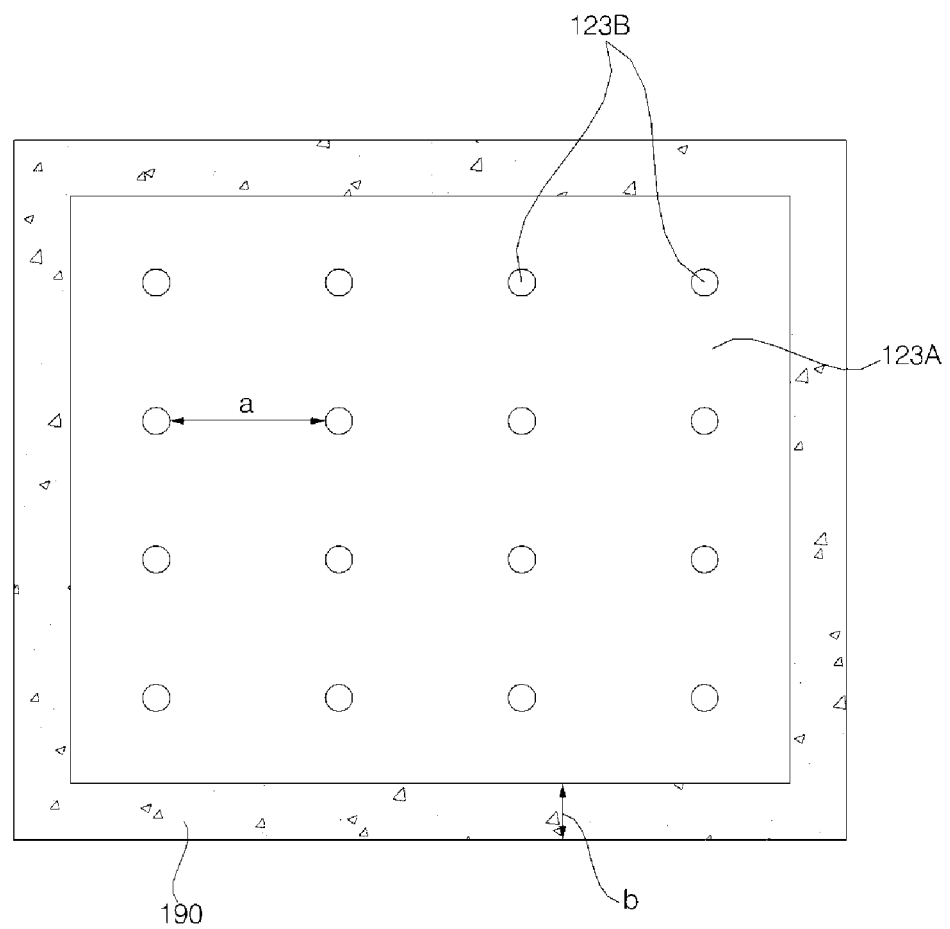
FIG. 2 is a sectional plan view taken along the line A-A of FIG. 1.

FIG. 1 is a sectional view illustrating a light emitting device according to an embodiment and FIG. 2 is a sectional plan view taken along the line A-A of FIG. 1.

Referring to FIG. 1, the light emitting device 100 according to the present embodiment includes a conductive substrate 110, a first electrode layer 120 disposed on the conductive substrate 110, a light emitting structure 140 including a first semiconductor layer 141, a second semiconductor layer 145 disposed above the first electrode layer 120, and an active layer 143 disposed between the first semiconductor layer 141 and the second semiconductor layer 145, a second electrode layer 150 electrically connected to the second semiconductor layer 145 and an anti-crack layer 190 disposed below the light emitting structure 140.

The conductive substrate 110 supports the light emitting structure 140 and the conductive substrate 110 together with the second electrode layer 150 supplies power to the light emitting structure 140. The conductive substrate 110 may be formed of a highly thermally conductive material or a conductive material, for example, at least one selected from a group consisting of gold (Au), nickel (Ni), tungsten (W), molybdenum (Mo), copper (Cu), aluminum (Al), tantalum (Ta), silver (Ag), platinum (Pt), chromium (Cr), Si, Ge, GaAs, ZnO, GaN, $Ga_2O_3$, SiC, SiGe and CuW, or an alloy of two or more thereof, or a stack of two or more different substances thereof. That is, the conductive substrate 110 may be implemented as a carrier wafer.

The conductive substrate 110 facilitates conduction of heat emitted from the light emitting device 100 and thereby improves thermal stability of the light emitting device 100.

In the present embodiment, the conductive substrate 110 has conductivity. However, the conductive substrate may not have conductivity, but the disclosure is not limited thereto.

The light emitting device includes the first electrode layer 120 to supply power, disposed on the conductive substrate 110. Detailed description of the first electrode layer 120 will be given later.

The light emitting device may further include a window layer 130 to reduce the difference in reflectivity between the first electrode layer 120 and the light emitting structure 140, disposed on the first electrode layer 120.

The window layer 130 reduces the difference in reflectivity between the light emitting structure 140 and the first electrode layer 120 and thereby improves light extraction efficiency.

The window layer 130 may include at least one of GaP, GaAsP or AlGaAs.

The light emitting structure 140 includes the first semiconductor layer 141, the second semiconductor layer 145 and the active layer 143 disposed between the first semiconductor layer 141 and the second semiconductor layer 145.

The second semiconductor layer 145 may be an n-type semiconductor layer and the n-type semiconductor layer may be doped with a semiconductor material having a formula of $In_xAl_yGa_{1-x-y}N$ ($0 \leq x \leq 1$, $0 \leq y \leq 1$, $0 \leq x+y \leq 1$) which is for example at least one selected from a group consisting of GaN, AlN, AlGaN, InGaN, InN, InAlGaN and AlInN, or the n-type semiconductor layer may be doped with an n-type dopant such as Si, Ge, Sn, Se or Te. In addition, the second semiconductor layer 145 may be selected from semiconductor materials having a formula of $(Al_xGa_{1-x})_{0.5}In_{0.5}P$.

Meanwhile, the second electrode layer 150 electrically connected to the second semiconductor layer 145 may be disposed on the second semiconductor layer 145 and the second electrode layer 150 may include at least one pad and/or at least one electrode having a predetermined pattern. The second electrode layer 150 may be disposed in central, outside or edge portions of an upper surface of the second semiconductor layer 145, but the disclosure is not limited thereto. The second electrode layer 150 may be disposed in other portions rather than portions of the upper surface of the second semiconductor layer 145, but the disclosure is not limited thereto.

The second electrode layer 150 may be formed as a monolayer or multilayer structure using a conductive material, for example, at least one of a metal selected from the group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof.

A roughness pattern 160 to improve light extraction efficiency may be formed in a part or entire region of the surface of the second semiconductor layer 145, in which the second electrode layer 150 is not formed, by a predetermined etching method.

In the present embodiment, the second electrode layer 150 is formed on a flat surface on which the roughness pattern 160 is not formed, but the second electrode layer 150 may be formed on the upper surface of the second semiconductor layer 145 in which the roughness pattern 160 is formed and the disclosure is not limited thereto.

The roughness pattern 160 may be formed by etching at least one portion of the upper surface of the second semiconductor layer 145 and the disclosure is not limited thereto. The etching process includes a wet and/or dry etching process. After the etching process, the upper surface of the second semiconductor layer 145 may have the roughness pattern 160. The roughness pattern 160 having a random size may be irregularly formed, but the disclosure is not limited thereto. The roughness pattern 160 is a non-flat surface and includes at least one of a texture pattern, a roughness pattern and an uneven pattern.

A side cross-section of the roughness pattern 160 may be formed to have various shapes, such as cylindrical, polyprism, conical, polypyramidal, circular truncated conical, hexagonal and frusto pyramidal shapes and include a conical or polypyramidal shape.

Meanwhile, the roughness pattern 160 may be formed by a method such as photo-electro chemical (PEC) and the disclosure is not limited thereto. As the roughness pattern 160 is formed on the upper surface of the second semiconductor layer 145, a phenomenon in which light generated by the active layer 143 is total-reflected from the upper surface of the second semiconductor layer 145 and is then re-absorbed or scattered is prevented, thereby contributing to improvement of light extraction efficiency of the light-emitting device 100.

The active layer 143 may be disposed under the second semiconductor layer 145. The active layer 143 is an area in which electrons recombine with holes and generate light having a wavelength corresponding to transition to a lower energy level upon recombination therebetween.

The active layer 143 may for example have a single quantum well structure or a multi-quantum well (MQW) structure including a semiconductor material having a formula of a $In_xAl_yGa_{1-x-y}N$ ($0 \leq x \leq 1$, $0 \leq y \leq 1$, $0 \leq x+y \leq 1$). In addition, the active layer 143 may be selected from semiconductor materials having a formula of $(Al_xGa_{1-x})_{0.5}In_{0.5}P$.

Accordingly, more electrons are collected to a low energy level of a quantum well layer and as a result, the probability of recombination of electrons with holes increases and luminous efficacy is thus improved. In addition, the active layer 143 may have a quantum wire structure or a quantum dot structure.

The first semiconductor layer 141 may be disposed under the active layer 143. The first semiconductor layer 141 may be a p-type semiconductor layer and enable injection of holes into the active layer 143. For example, the p-type semiconductor layer may be formed of a semiconductor material having a formula of $In_xAl_yGa_{1-x-y}N$ ($0 \leq x \leq 1$, $0 \leq y \leq 1$, $0 \leq x+y \leq 1$) wherein the semiconductor material is for example at least one selected from a group consisting of GaN, AlN, AlGaN, InGaN, InN, InAlGaN and AlInN, and the p-type semiconductor layer may be doped with a p-type dopant such as Mg, Zn, Ca, Sr or Ba. In addition, the first semiconductor layer 141 may be selected from semiconductor materials having a formula of $(Al_xGa_{1-x})_{0.5}In_{0.5}P$.

In addition, a third semiconductor layer (not shown) may be formed under the first semiconductor layer 141. The third semiconductor layer may be implemented with a semiconductor layer having a polarity opposite to the second semiconductor layer.

Meanwhile, the second semiconductor layer 145, the active layer 143 and the first semiconductor layer 141 may be formed by a method such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) and sputtering and the disclosure is not limited thereto.

In addition, unlike what has been described above, in an embodiment, the second semiconductor layer 145 may be implemented with a p-type semiconductor layer and the first semiconductor layer 141 may be implemented with an n-type semiconductor layer, but the disclosure is not limited thereto. Accordingly, the light emitting structure 140 may have at least one of N-P, P-N, N-P-N and P-N-P junction structures.

In addition, a passivation 170 may be formed in a part or the entirety of an outer circumferential surface of the light emitting structure 140 to protect the light emitting device from exterior shock and prevent short-circuit.

Referring to FIGS. 1 and 2, the first electrode layer 120 may include a metal or a light-transmitting conductive layer and supply power to the light emitting structure 140. The first electrode layer 120 may be formed of a conductive material, for example, at least one selected from a group consisting of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), indium zinc oxide (IZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), $IrO_x$, $RuO_x$, $RuO_x$/ITO, Ni/$IrO_x$/Au, and Ni/$IrO_x$/Au/ITO, but the disclosure is not limited thereto.

The first electrode layer 120 may include at least one of an ohmic layer 123 and a metal reflective layer 125. In addition, the first electrode layer 120 may include at least one of the ohmic layer 123, the metal reflective layer 125 and a metal adhesive layer 121.

For example, the first electrode layer 120 may have a structure in which the metal reflective layer 125 and the ohmic layer 123 are stacked in this order on the metal adhesive layer 121. FIG. 1 shows a configuration in which the ohmic layer 123 is disposed on the metal adhesive layer 121.

The ohmic layer 123 may include a transparent electrode layer 123A disposed between the conductive substrate 110 and the light emitting structure 140 and a plurality of metal contact portions 123B vertically passing through the transparent electrode layer 123A.

The transparent electrode layer 123A may be formed of a material which exhibits conductivity when transmitting light reflected by the conductive substrate 110 or the metal reflective layer 125. For example, the transparent electrode layer 123A may include at least one of $In_2O_3$, $SnO_2$, ZnO, ITO, CTO, $CuAlO_2$, $CuGaO_2$ and $SrCu_2O_2$.

The metal contact portions 123B are disposed such that they vertically pass through the transparent electrode layer 123A. The metal contact portions 123B may be regularly spaced apart from each other by a predetermined distance. The metal contact portions 123B has a characteristic of ohmic-contact with the light emitting structure 140.

In addition, at least one surface of the metal contact portions 123B may contact the first semiconductor layer 141 of the light emitting structure 140 and the other surface thereof may contact the conductive substrate 110.

The metal contact portions 123B include AuBe.

When the metal contact portions 123B are disposed to pass through the transparent electrode layer 123A, there is an advantage in that they readily contact electrically the light emitting structure 140. In addition, as the metal contact portions 123B pass through the transparent electrode layer 123A, heat generated by the light emitting structure 140 is advantageously readily discharged to the conductive substrate 110.

In addition, the metal contact portion 123B directly contacts the light emitting structure 140, thus advantageously decreasing a forward voltage (VF). In particular, operating voltage is decreased by about 10%, as compared to a case in which the metal contact portions 123B do not pass through the transparent electrode layer 123A. The reason for this is that the transparent electrode layer 123A has lower conductivity than the metal contact portion 123B.

In particular, referring to FIG. 2, a planar area of the transparent electrode layer 123A may be larger than a planar area of the metal contact portion 123B. The planar area of the metal contact portion 123B may be 10% to 25% with respect to the planar area of the transparent electrode layer 123A. When the planar area of the metal contact portion 123B is less than 10% with respect to the planar area of the transparent electrode layer 123A, it is difficult to form the ohmic contact between the light emitting structure 140 and the first electrode layer 120 and when the planar area of the metal contact portion 123B is greater than 25% with respect to the planar area of the transparent electrode layer 123A, luminous efficacy of light emitting device 100 is disadvantageously deteriorated due to low light transmittance of the metal contact portion 123B.

For example, the distance between adjacent metal contact portions 123B is 35 μm to 50 μm and a width of the metal contact portions 123B is 10 μm to 20 μm so as to adjust the planar area of the metal contact portion 123B to 10% to 25% with respect to the planar area of the transparent electrode layer 123A.

The metal contact portions 123B may have a rod shape, and the disclosure is not limited thereto. The metal contact portions may have a cylindrical or polyprism shape.

The first electrode layer 120 may be flat, as shown in FIG. 1, but the disclosure is not limited. The first electrode layer 120 may have a step.

The first electrode layer 120 may further include a metal adhesion layer 121.

The metal adhesion layer 121 is formed under the ohmic layer 123 and reinforces adhesion between the layers. The metal adhesion layer 121 may be formed of a material having superior adhesion to lower materials. For example, the metal adhesion layer 121 may include at least one of a PbSn alloy, a AuGe alloy, a AuBe alloy, a AuSn alloy, Sn, In, a SnIn alloy or a PdIn alloy. In addition, an anti-diffusion film (not shown) may be further disposed on the metal adhesion layer 121. The anti-diffusion film prevents materials for the conductive substrate 110 and the metal adhesion layer 121 from diffusing to the light emitting structure 140. The anti-diffusion film may be formed of a material preventing diffusion of metals and the material for example includes at least one of platinum (Pt), palladium (Pd), tungsten (W), nickel (Ni), ruthenium (Ru), molybdenum (Mo), iridium (Ir), rhodium (Rh), tantalum (Ta), hafnium (Hf), zirconium (Zr), niobium (Nb) and vanadium (V), and alloys of two or more thereof, but the disclosure is not limited thereto. The metal adhesion layer 121 may have a mono or multi-layer structure.

The anti-crack layer 190 is disposed on the boundary on which the light emitting structure 140 is divided (cut) on a chip basis and prevents cracks. The chip means a unit on which a wafer (not shown) on which the light emitting structure 140 is stacked is divided into respective light emitting devices and detailed description thereof will be given later associated with a method for manufacturing the light emitting device.

The anti-crack layer 190 is disposed such that it contacts a portion of the light emitting structure 140, preferably, on a lower circumference of the light emitting structure 140.

A planar shape (see FIG. 2) of the anti-crack layer 190 may be a ring, loop, frame or mesh shape or the like to form a closed area and a size of the closed area corresponds to a size of the light emitting device. Here, the closed area means a closed area on a plane of FIG. 2.

A width b of the anti-crack layer 190 is not limited. When the width b is excessively small, it is difficult to prevent peeling from the light emitting structure 140, and when the width b is excessively great, luminous efficacy of the light emitting device may be deteriorated. Accordingly, the width b is preferably 30 μm to 70 μm.

In addition, the anti-crack layer 190 contacts a lower part of the light emitting structure 140 and is flush with the first electrode layer 120. That is, the light emitting structure 140 functions to supply power and prevent cracks during cutting of the light emitting structure 140. Here, the expression "flush with" does not necessarily mean completely flush with and means substantially flush with. That is, the anti-crack layer 190 is disposed at an outside of the first electrode layer 120.

The anti-crack layer 190 may contact electrically the lower part of the light emitting structure 140. For example, when the lower part of the light emitting structure 140 is the first semiconductor layer 141, the anti-crack layer 190 contacts electrically the first semiconductor layer 141, and when the lower part of the light emitting structure 140 is the window layer 130, the anti-crack layer 190 contacts electrically a lower part of the window layer 130.

When the anti-crack layer 190 contacts electrically a lower part of the circumference of the light emitting structure 140, peeling between the light emitting structure 140 and the first electrode layer 120 and/or the conductive substrate 110 when cutting the light emitting structure 140 on a chip basis can be prevented. In addition, the anti-crack layer 190 is disposed on the boundary between chip-units of the light emitting structure 140 and is cut together with the light emitting structure 140, thus preventing cracking.

The anti-crack layer 190 may include a conductive metal material which for example includes at least one of Au, AuBe and an Au alloy.

In addition, the anti-crack layer 190 may have a mono- or multi-layer structure. For example, the anti-crack layer 190 may have a structure of Au, Au/AuBe or Au/AuBe/Au, but the disclosure is not limited thereto.

When the anti-crack layer 190 is formed of Au or an Au alloy, it functions to prevent cracking and peeling upon cutting of the light emitting structure 140 and supply power to the light emitting structure 140, thus advantageously preventing deterioration in luminous efficacy of the light emitting device.

Meanwhile, when the light emitting structure 140 further includes the window layer 130, a portion of the window layer 130 contacting the anti-crack layer 190 is doped with a dopant having the same polarity as the first semiconductor layer 141. Because the present embodiment is provided under the assumption that the first semiconductor layer 141 is doped with a p-type dopant, the description is given under the assumption that a portion of the window layer 130 contacting the anti-crack layer 190 is doped with a p-type dopant.

When the window layer 130 is doped, transmittance of light decreases, but the capacity of the window layer 130 to contact electrically the anti-crack layer 190 increases. Accordingly, an area of the doped window layer 130 is formed only in an inner area of the window layer 130 contacting the anti-crack layer 190, thus bringing the window layer 130 into ohmic-contact with the anti-crack layer 190. In addition, the portion of the window layer 130 contacting the anti-crack layer 190 decreases and light transmittance is not greatly deteriorated. As a result, the window layer 130 contacts electrically the anti-crack layer 190 without greatly decreasing light transmittance of the window layer 130.

In addition, as the window layer 130 contacts electrically the anti-crack layer 190, advantageously, operating voltage of the light emitting device 100 decreases, light transmittance of the window layer 130 is not greatly deteriorated, luminous efficacy of the light emitting device is not greatly deteriorated, and cracking of the light emitting structure 140 is prevented.

The p-type dopant doped into the portion of the window layer 130 contacting the anti-crack layer 190 may include at least one of Mg, Zn, Ca, Sr, Ba and C.

When the portion of the window layer 130 contacting the anti-crack layer 190 is doped at an excessively high concentration, light transmittance is remarkably deteriorated, and when the portion is doped at an excessively low concentration, ohmic-contact between the window layer 130 and the anti-crack layer 190 may be difficult. Accordingly, when the portion of the window layer 130 contacting the anti-crack layer 190 is doped with Mg, a doping concentration is preferably $5\times10^{18}/cm^3$ to $1\times10^{18}/cm^3$ and, when the portion is doped with C, a doping concentration is preferably $5\times10^{19}/cm^3$ to $1\times10^{19}/cm^3$.

Figure 3:
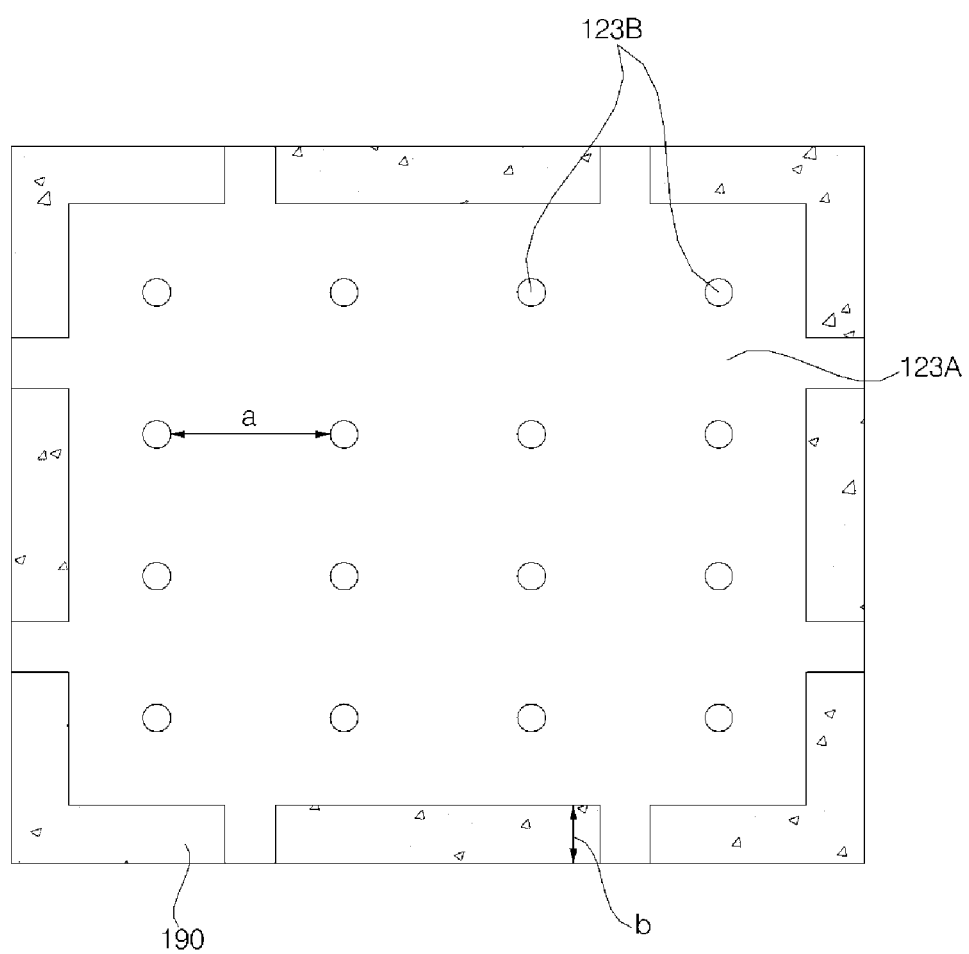
FIG. 3 is a sectional plan view taken along the line A-A according to another embodiment.

FIG. 3 is a sectional plan view taken along the line A-A according to another embodiment.

The light emitting device 100 according to the present embodiment is different from the embodiment shown in FIG. 2 in view of disposition of the anti-crack layer 190.

Referring to FIG. 3, the anti-crack layer 190 may be disposed continuously or non-continuously on the boundary between chips. In FIG. 3, the anti-crack layer 190 may be non-continuously disposed on the circumference of the light emitting structure 140 which is the boundary between chips.

The non-continuously disposed anti-crack layer 190 prevents cracking of the light emitting device and reduces manufacturing cost.

Figure 4:
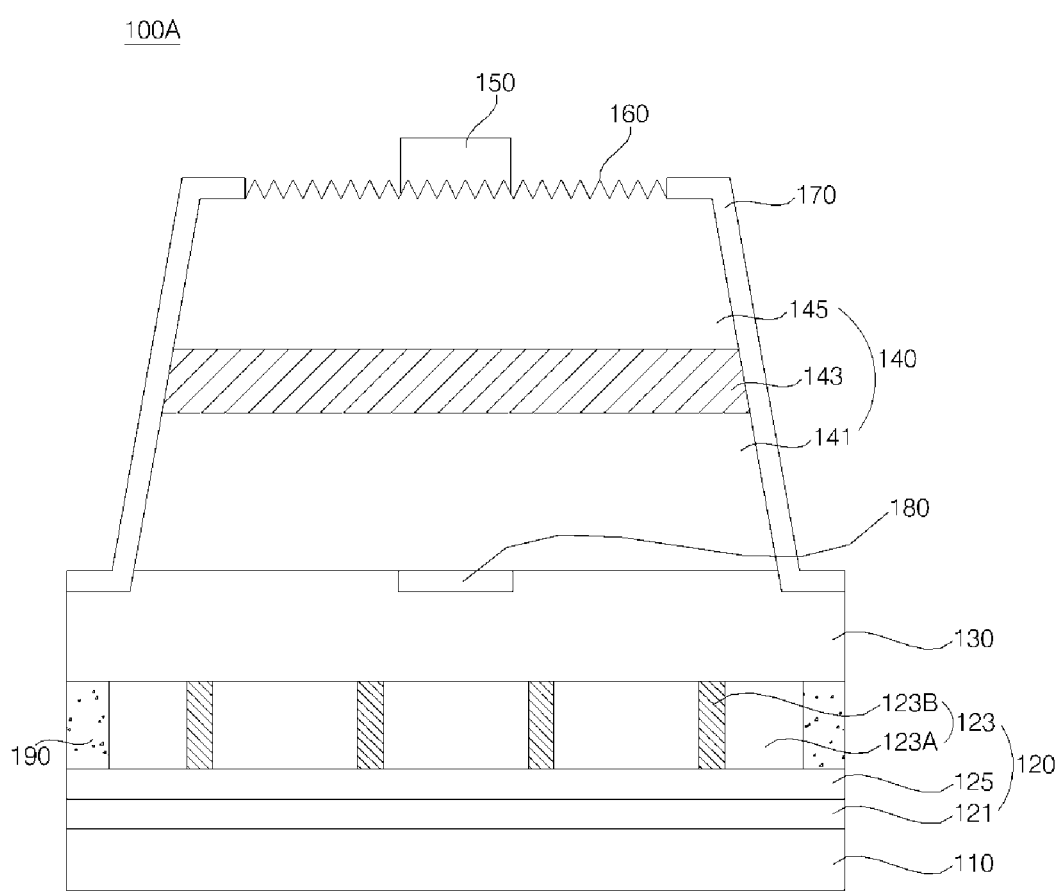
FIG. 4 is a sectional view illustrating a light emitting device according to another embodiment.

FIG. 4 is a sectional view illustrating a light emitting device according to another embodiment.

Referring to FIG. 4, the light emitting device 100A may further include a metal reflective layer 125 and a current blocking layer 180, when compared to the embodiment shown in FIG. 1.

The first electrode layer 120 may further include a metal reflective layer 125. The metal reflective layer 125 is disposed below the ohmic layer 123 and reflects the light emitting from the active layer 143 toward the conductive substrate 110 to an upward of the light emitting structure 140.

The metal reflective layer 125 may be formed of a highly reflective material, for example, Ag, Ni, Al, Rh, Pd, Ir, Ru, Mg, Zn, Pt, Au, or Hf or a combination thereof, or may be formed as a multilayer structure using a metal material and a light-transmitting conductive material such as IZO, IZTO, IAZO, IGZO, IGTO, AZO, or ATO. In addition, the reflective layer (not shown) may have a stack structure of IZO/Ni, AZO/Ag, IZO/Ag/Ni, or AZO/Ag/Ni.

The current blocking layer 180 may be disposed under the light emitting structure 140 such that at least one portion of the current blocking layer 180 overlaps the second electrode layer 150 in a vertical direction and have lower electrical conductivity than the ohmic layer 123 or the metal reflective layer 125. The current blocking layer 180 may include at least one of aluminum oxide ($Al_2O_3$), silicon oxide ($SiO_2$), silicon nitride ($Si_3N_4$), titanium oxide ($TiO_x$), indium tin oxide (ITO), aluminum zinc oxide (AZO) and indium zinc oxide (IZO), but the disclosure is not limited thereto.

The current blocking layer 180 may be an electron blocking layer which prevents a phenomenon in which, upon application of high current, electrons injected into the active layer 143 from the second semiconductor layer 145 are not recombined with holes in the active layer 143 and enter the first electrode layer 120. The current blocking layer 180 has a larger band gap than the active layer 143, thereby preventing the phenomenon in which electrons injected into the active layer 143 from the second semiconductor layer 145 are not recombined in the active layer 143 and enter the first electrode layer 120. As a result, the probability of recombination of electrons with holes in the active layer 143 is increased and leakage current is prevented.

Figure 5:
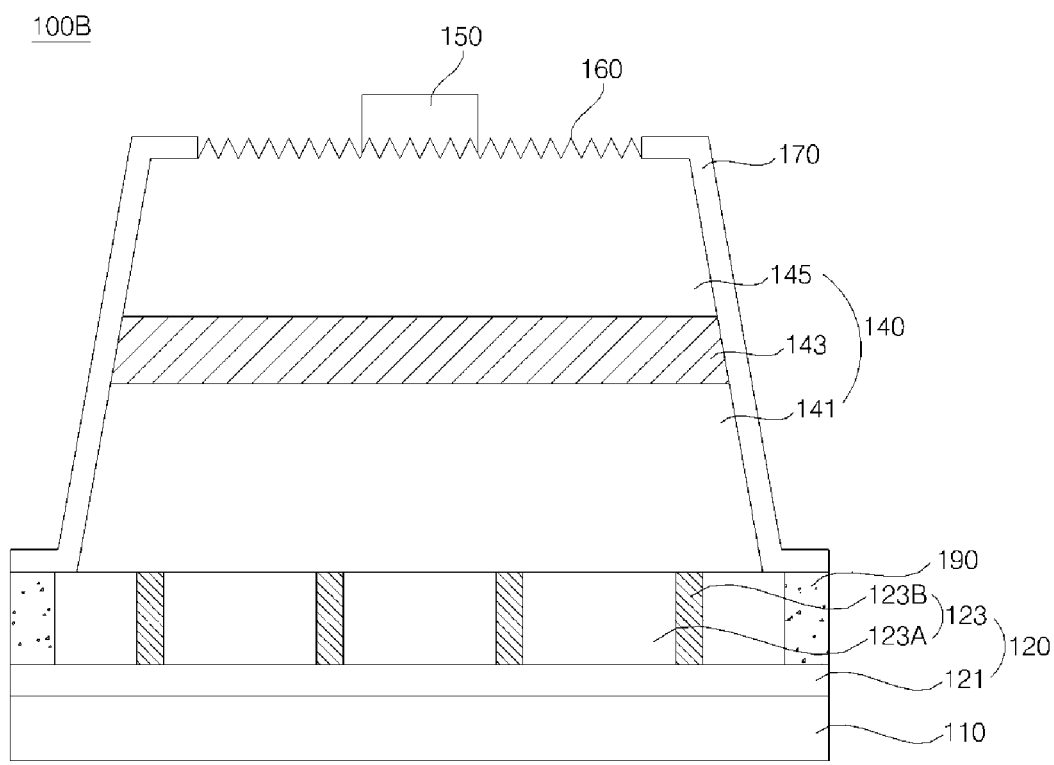
FIG. 5 is a sectional view illustrating a light emitting device according to another embodiment.

FIG. 5 is a sectional view illustrating a light emitting device according to another embodiment.

The light emitting device 100B according to the present embodiment is different from the embodiment shown in FIG. 1 in view of presence of the window layer 130.

Referring to FIG. 5, the light emitting device 100B according to the present embodiment excludes the window layer 130 and the anti-crack layer 190 contacts the first semiconductor layer 141 of the light emitting structure 140.

FIGS. 6 to 10 are flowcharts illustrating a method for manufacturing the light emitting device of FIG. 1.

The method for manufacturing the light emitting device according to the embodiment will be described.

Figure 6:
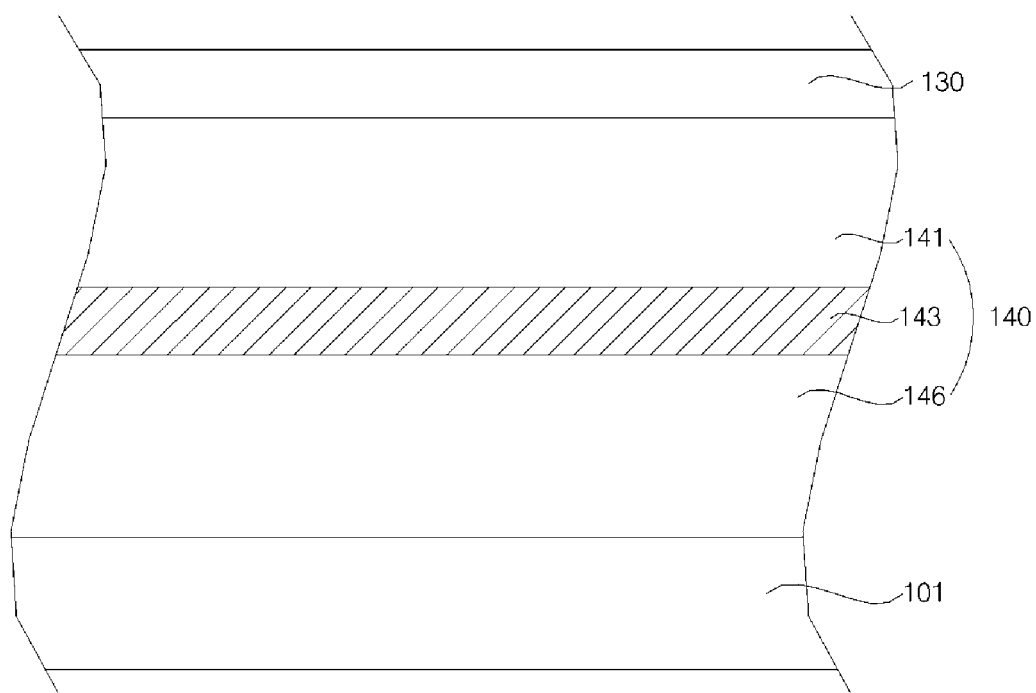
FIGS. 6 to 10 are flowcharts illustrating a method for manufacturing a light emitting device according to an embodiment.

Referring to FIG. 6, a light emitting structure 140 including a second semiconductor layer 146, an active layer 143 and a first semiconductor layer 141 disposed in this order is stacked on a growth substrate 101.

A window layer 130 may be disposed on the light emitting structure 140.

The growth substrate 101 may be selected from the group consisting of sapphire substrate ($Al_2O_3$), GaN, SiC, ZnO, Si, GaP, InP, and GaAs. Although not shown, a buffer layer (not shown) may be formed between the growth substrate 101 and the light emitting structure 140.

The buffer layer (not shown) may be formed of either a compound of Group III and V elements, or GaN, InN, AlN, InGaN, AlGaN, InAlGaN, or AlInN and may be doped with a dopant.

An undoped semiconductor layer (not shown) may be formed on the growth substrate 101 or the buffer layer (not shown) and one or both of the buffer layer (not shown) and the undoped semiconductor layer (not shown) may or may not be formed, but the disclosure is not limited thereto.

Figure 7:
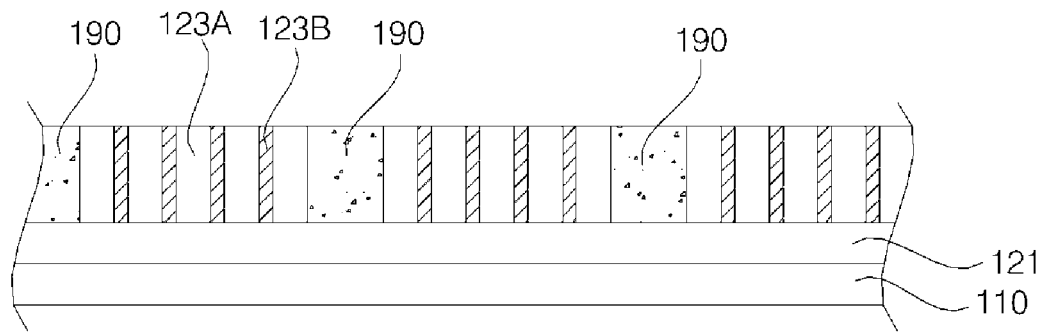

Referring to FIG. 7, a conductive substrate 110 is prepared and a first electrode layer 120 is bonded to an upper surface of the conductive substrate 110.

The formation method of the first electrode layer 120 is not limited. For example, photo-resist (PR) (not shown) having a predetermined pattern may be disposed on a transparent electrode layer 123A. The PR may be disposed as a predetermined pattern such that the PR corresponds to the metal contact portion 123B in consideration of current diffusion and light extraction efficiencies.

Then, portions of the transparent electrode layer 123A, excluding portions vertically overlapping portions in which the PR is disposed, are removed. Cross-sections of the removed portions may have a rectangular shape, a curve portion or a step portion, but the disclosure is not limited thereto. The removal may be carried out using a method such as wet etching, dry etching or laser lift off (LLO), but the disclosure is not limited thereto.

Then, a plurality of metal contact portions 123B may be respectively formed in the etched portions.

In addition, a plurality of anti-crack layers 190 are formed on the first electrode layer 120 on the boundaries between the light emitting device segments divided on a chip basis. The formation method of the anti-crack layers 190 is the same as that of the metal contact portions 123B.

Figure 8:
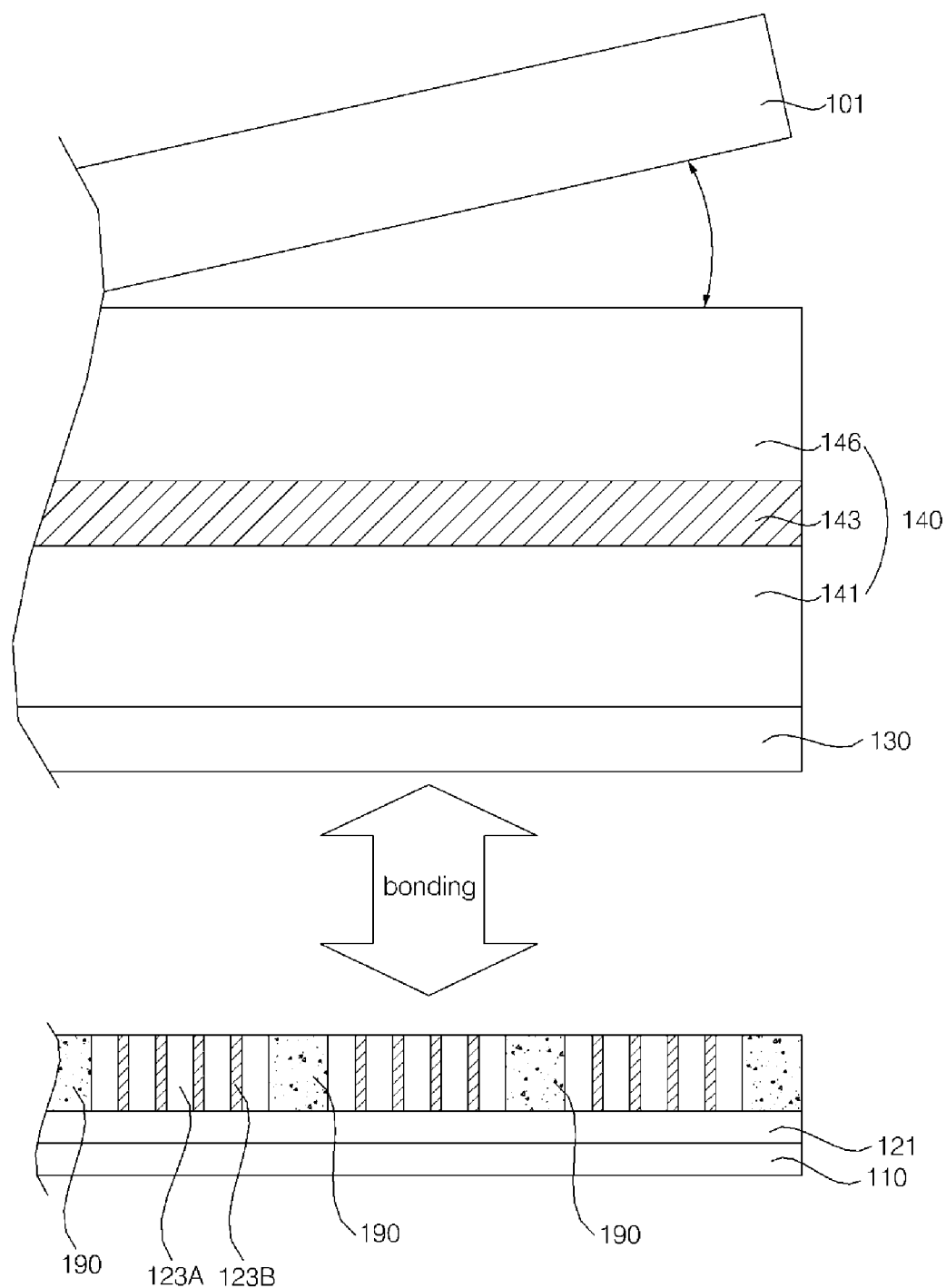

Referring to FIG. 8, the growth substrate 101 disposed on the second semiconductor layer 146 may be removed.

The growth substrate 101 may be removed by a physical and/or chemical method and the physical method is for example laser lift off (LLO).

In addition, the conductive substrate 110 provided with the first electrode layer 120 is bonded to the light emitting structure 140.

Figure 9:
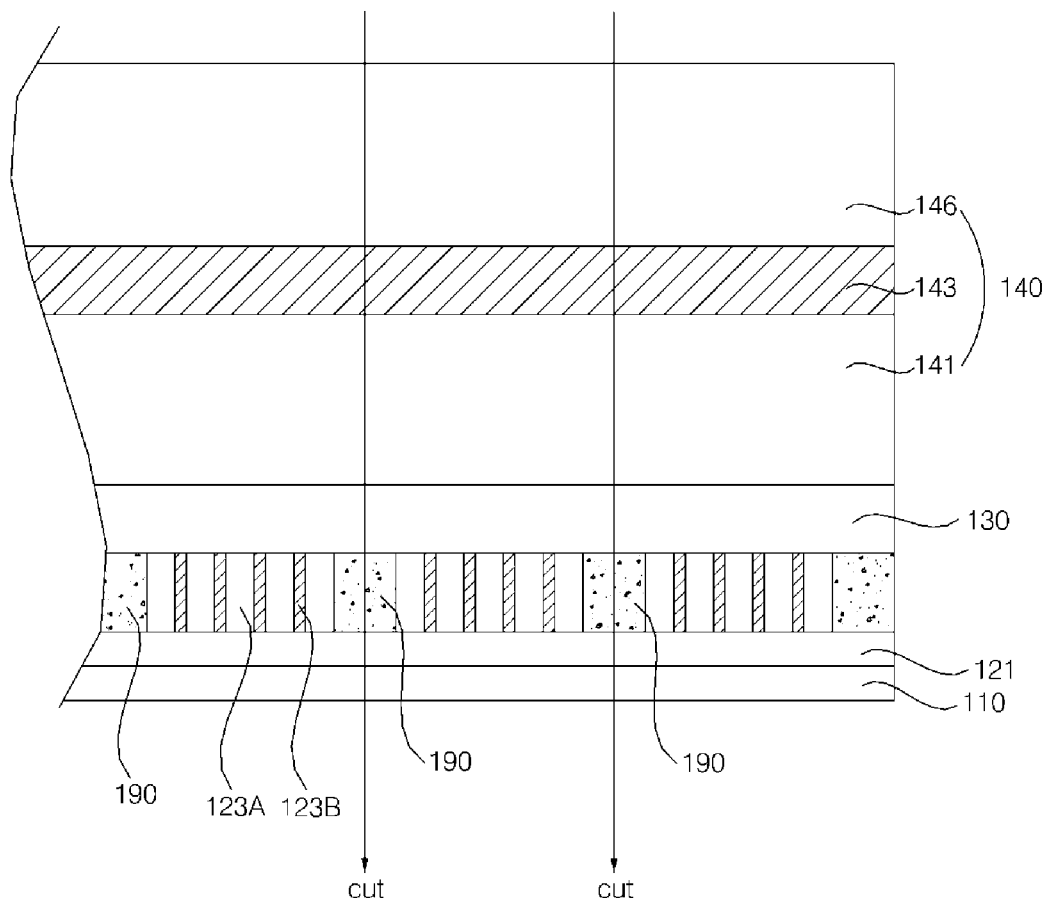

Referring to FIG. 9, the structure in which the light emitting structure 140 is boned to the conductive substrate 110 is cut on a chip basis. The cutting may be carried out using a laser or a blade, but the disclosure is not limited thereto.

Figure 10:
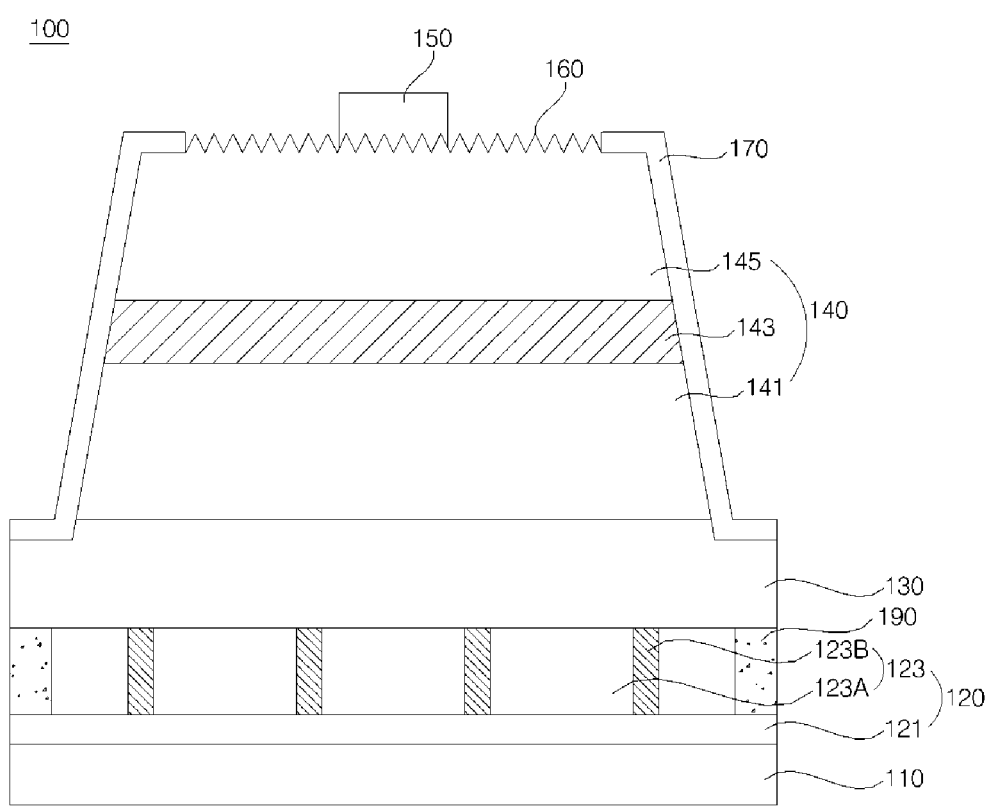

Referring to FIG. 10, a passivation 170 may be formed in a part or entirety of an outer circumferential surface of the light emitting structure 140.

In addition, a roughness pattern 160 may be formed in a part or entirety of a surface of the second semiconductor layer 146 of the light emitting structure 140 by a predetermined etching method, and a second electrode layer 150 is formed on the surface of the second semiconductor layer 146.

In addition, an order of one or more processes shown in FIGS. 6 to 10 may be changed, but the disclosure is not limited thereto.

Figure 11:
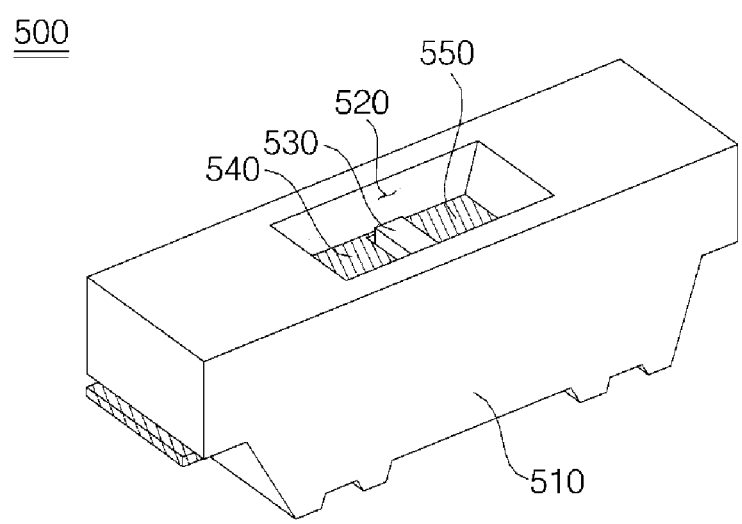
FIG. 11 is a perspective view illustrating a light emitting device package including a light emitting device according to an embodiment.
Figure 12:
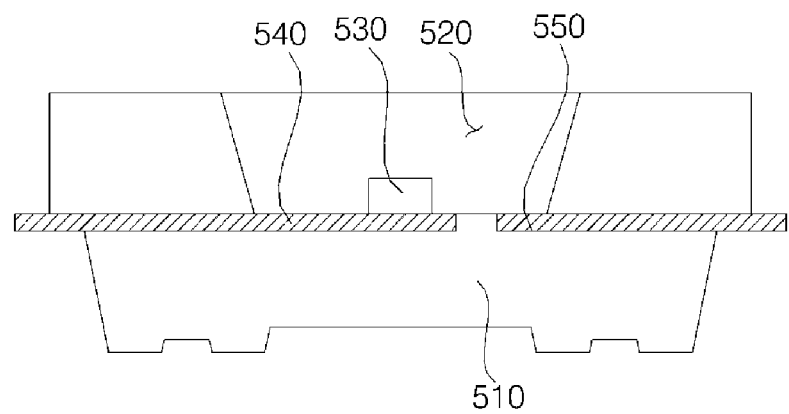
FIG. 12 is a sectional view illustrating the light emitting device package including the light emitting device according to the present embodiment.

FIG. 11 is a perspective view illustrating a light emitting device package including a light emitting device according to an embodiment and FIG. 12 is a sectional view illustrating the light emitting device package including the light emitting device according to the present embodiment.

Referring to FIGS. 11 and 12, a light-emitting device package 500 includes a body 510 provided with a cavity 520, first and second lead frames 540 and 550 mounted on the body 510, a light-emitting device 530 electrically connected to the first and second lead frames 540 and 550, and a sealant (not shown) filling the cavity 520 to cover the light-emitting device 530.

The body 510 may be composed of at least one selected from resin materials such as polyphthalamide (PPA), silicon (Si), aluminum (Al), aluminum nitride (AlN), photosensitive glass (PSG), polyamide9T (PA9T), syndiotactic polystyrene (SPS), metal materials, sapphire ($Al_2O_3$), beryllium oxide (BeO) and printed circuit boards (PCB). The body 510 may be formed by a process such as injection molding and etching, but the disclosure is not limited thereto.

The inner surface of the body 510 may be provided with an inclined surface. A reflective angle of light emitted from the light-emitting device 530 may be changed depending on an angle of the inclined surface. Accordingly, the orientation angle of light discharged to the outside can be controlled.

As the orientation angle of light decreases, convergence of light emitted from the light-emitting device 530 to the outside increases. On the other hand, as the orientation angle of light increases, convergence of light from the light-emitting device 530 to the outside decreases.

Meanwhile, as seen from above, the cavity 520 provided in the body 510 may have various shapes including, but not limited to, a circular shape, a rectangular shape, a polygonal shape, an oval shape and a shape with curved corners.

The light-emitting device 530 is mounted on the first lead frame 540 and examples thereof include, but are not limited to, light-emitting devices emitting red, green, blue Or white light, and light-emitting devices emitting ultraviolet light. Further, one or more light-emitting devices 530 including the light-emitting device 530 may be mounted on the first lead frame 540.

Further, the light-emitting device 530 may be applied to all of a horizontal light-emitting device, in which all electrical terminals thereof are formed on the upper surface, a vertical light-emitting device, in which electrical terminals thereof are formed on the upper or lower surface, and a flip chip light-emitting device.

The cavity 520 is filled with the sealant (not shown) such that the sealant covers the light-emitting device 530.

The sealant (not shown) may be composed of silicone, epoxy or other resin material and may be formed by filling the cavity 520 with a sealant, followed by UV or heat curing.

In addition, the sealant (not shown) may include a phosphor, and a type of the phosphor is selected in consideration of the wavelength of light emitted from the light-emitting device 530 to allow the light-emitting device package 500 to render white light.

According to wavelength of light emitted from the light emitting device 530, the phosphor may include at least one of a blue light-emitting phosphor, a blue-green light emitting phosphor, a green light-emitting phosphor, a yellowish green light-emitting phosphor, a yellow light-emitting phosphor, a yellowish red light-emitting phosphor, an orange light-emitting phosphor and a red light-emitting phosphor.

That is, the phosphor is excited by first light emitted from the light emitting device 530 to produce second light. For example, in a case where the light emitting device 530 is a blue light emitting diode and the phosphor is a yellow phosphor, the yellow phosphor is excited by blue light to emit yellow light, blue light emitted from the blue light emitting diode is mixed with yellow light excited and generated by blue light to allow the light emitting device package 500 to render white light.

Similarly, in the case where the light emitting device 530 is a green light emitting diode, a magenta phosphor or a combination of blue and red phosphors may be used, and in the case where the light emitting device 530 is a red light emitting diode, a cyan phosphor or a combination of blue and green phosphors may be used.

Such a phosphor may be selected from known phosphors such as YAG, TAG, sulfides, silicates, aluminates, nitrides, carbides, nitridosililcates, borates, fluorides and phosphates.

The first and second lead frames 540 and 550 may include a metal material selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and alloys thereof. In addition, the first and second lead frames 540 and 550 may have a monolayer or multilayer structure, but are not limited thereto.

The first and second lead frames 540 and 550 are spaced from and electrically separated from each other. The light-emitting device 530 is mounted on the first and second lead frames 540 and 550, and the first and second lead frames 540 and 550 directly contact the light-emitting device 530, or are electrically connected thereto through a conductive material such as a soldering member (not shown). In addition, the light-emitting device 530 may be electrically connected to the first and second lead frames 540 and 550 via wire bonding, although the present invention is not limited thereto. Accordingly, when a power supply is connected to the first and second lead frames 540 and 550, power may be supplied to the light-emitting device 530. Meanwhile, plural lead frames (not shown) are mounted in the body 510 and respective lead frames (not shown) are electrically connected to the light-emitting device 530, although the disclosure is not limited thereto.

The light emitting device according to the present embodiment may be applied to a lighting system. The lighting system has a structure in which a plurality of light emitting devices are arrayed. The lighting system may include a display device shown in FIGS. 13 and 14, a lighting device shown in FIG. 15 and may include a luminaire, traffic lights, vehicle headlights, electronic boards and the like.

Figure 13:
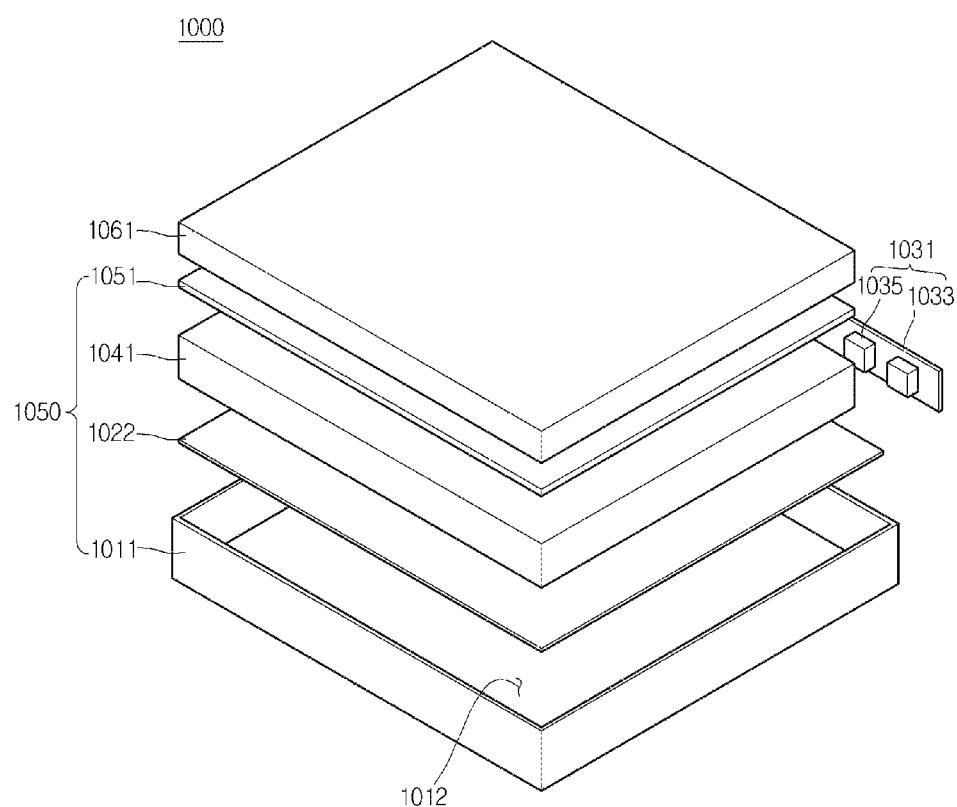
FIG. 13 is an exploded perspective view illustrating a display device including a light emitting device according to an embodiment.

FIG. 13 is an exploded perspective view illustrating a display device including a light emitting device according to an embodiment.

Referring to FIG. 13, the display device 1000 according to the present embodiment includes a light-guide plate 1041, a light source module 1031 for supplying light to the light-guide plate 1041, a reflective member (sheet) 1022 disposed under the light-guide plate 1041, an optical sheet 1051 disposed on the light-guide plate 1041, a display panel 1061 displayed on the optical sheet 1051, and a bottom cover 1011 accommodating the light-guide plate 1041, the light source module 1031 and the reflective member 1022, but the disclosure is not limited thereto.

The bottom cover 1011, the reflective sheet 1022, the light-guide plate 1041 and the optical sheet 1051 may be defined as a light unit 1050.

The light-guide plate 1041 functions to diffuse light, thereby providing a surface light source. The light-guide plate 1041 is formed of a transparent material, for example, an acrylic resin such as polymethyl methacrylate (PMMA), polyethylene terephthlate (PET), polycarbonate (PC), a cycloolefin copolymer (COC) or a polyethylene naphthalate (PEN) resin.

The light source module 1031 supplies light to at least one side of the light guide plate 1041 and functions ultimately as a light source of the display device.

The number of the light source module 1031 may be one or more and the light source module 1031 directly or indirectly supplies light to a side surface of the light-guide plate 1041. The light source module 1031 includes a substrate 1033 and a plurality of light emitting devices 1035 according to the present embodiment and the light emitting devices 1035 may be arrayed by a predetermined distance on the substrate 1033.

The substrate 1033 may be a printed circuit board (PCB) including a circuit pattern (not shown). The substrate 1033 may include not only a general PCB but also a metal core PCB (MCPCB), a flexible PCB or the like, but the disclosure is not limited thereto. When the light emitting device 1035 is mounted on a side surface of the bottom cover 1011 or an upper surface of the light discharge plate, the substrate 1033 may be removed. A portion of the light discharge plate may contact an upper surface of the bottom cover 1011.

In addition, the light emitting device 1035 may be mounted such that a light-emission surface of the substrate 1033 is spaced from the light-guide plate 1041 by a predetermined distance, but the disclosure is not limited thereto. The light emitting device 1035 may directly or indirectly supply light to a light-incident portion, a side surface of the light-guide plate 1041, but the disclosure is not limited thereto.

The reflective member 1022 may be disposed under the light-guide plate 1041. The reflective member 1022 reflects light incident upon a lower surface of the light-guide plate 1041 such that the light travels upwardly, thereby improving brightness of the light unit 1050. The reflective member 1022 may be formed of a material, for example, a PET, PC or PVC resin, but the disclosure is not limited thereto. The reflective member 1022 may correspond to the upper surface of the bottom cover 1011, but the disclosure is not limited thereto.

The bottom cover 1011 may accommodate the light-guide plate 1041, the light source module 1031, the reflective member 1022 and the like. For this purpose, the bottom cover 1011 may include an accommodation portion 1012 having an upper surface having an open box shape, but the disclosure is not limited thereto. The bottom cover 1011 may be bonded to a top cover, but the disclosure is not limited thereto.

The bottom cover 1011 may be formed of a metal or resin material and may be formed by a molding process such as press molding or extrusion molding. In addition, the bottom cover 1011 may include a highly thermally conductive metal or non-metal material, but the disclosure is not limited thereto.

The display panel 1061 is for example an LCD panel, which includes first and second substrates, which face each other and are formed of a transparent material, and a liquid crystal layer disposed between the first and second substrates. A polarization plate may be bonded to at least one surface of the display panel 1061 and the bonding structure of the polarization plate is not limited thereto. The display panel 1061 displays information through light passing through the optical sheet 1051. The display device 1000 may be applied to a variety of cellular terminals, monitors for notebook computers, monitors for laptop computers, televisions and the like.

The optical sheet 1051 is disposed between the display panel 1061 and the light-guide plate 1041 and includes at least one light-transmitting sheet. The optical sheet 1051 may for example include at least one of diffusion sheets, horizontal and vertical prism sheets, and brightness-reinforcing sheets. The diffusion sheet diffuses incident light, the horizontal and/or vertical prism sheet collects incident light in a display area and the brightness-reinforcing sheet reuses lost light and thereby improves brightness. In addition, a protective sheet may be disposed on the display panel 1061, but the disclosure is not limited thereto.

Here, the light-guide plate 1041 or the optical sheet 1051 as optical members may be disposed in a light passage of the light source module 1031, but the disclosure is not limited thereto.

Figure 14:
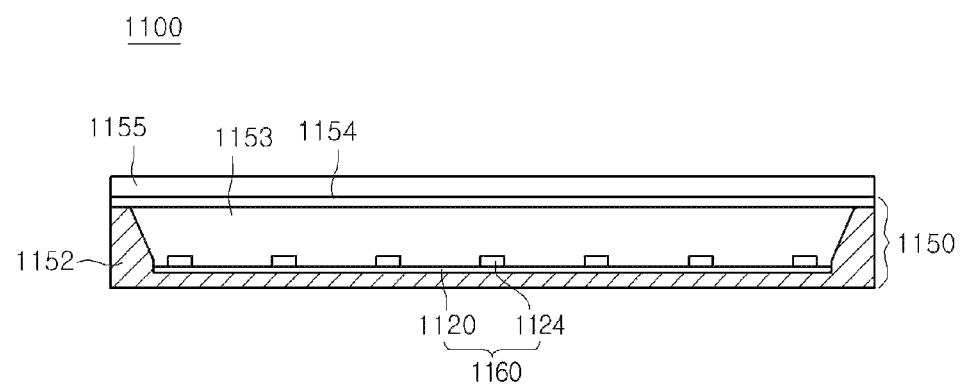
FIG. 14 is a view illustrating the display device of FIG. 13.

FIG. 14 is a view illustrating a display device including a light emitting device according to an embodiment.

Referring to FIG. 14, the display device 1100 includes a bottom cover 1152, a substrate 1120 on which the light emitting device 1124 is arrayed, an optical member 1154, and a display panel 1155.

The substrate 1120 and the light emitting device 1124 may be defined as a light source module 1160. The bottom cover 1152, at least one light source module 1160 and the optical member 1154 may be defined as a light unit 1150. The bottom cover 1152 may include an accommodation portion 1153, but the disclosure is not limited thereto. The light source module 1160 includes a substrate 1120 and a plurality of light emitting devices 1124 disposed on the substrate 1120.

Here, the optical member 1154 may include at least one of a lens, a light-guide plate, a diffusion sheet, horizontal and vertical prism sheets, a brightness-reinforcing sheet and the like. The light-guide plate may be formed of a PC or polymethyl methacrylate (PMMA) material and the light-guide plate may be removed. The diffusion sheet diffuses incident light, the horizontal and vertical prism sheets collect incident light to a display area and the brightness-reinforcing sheet reuses lost light and thereby improves brightness.

The optical member 1154 is disposed on the light source module 1160 and converts light emitted from the light source module 1160 into surface light, diffuses light or collects light.

Figure 15:
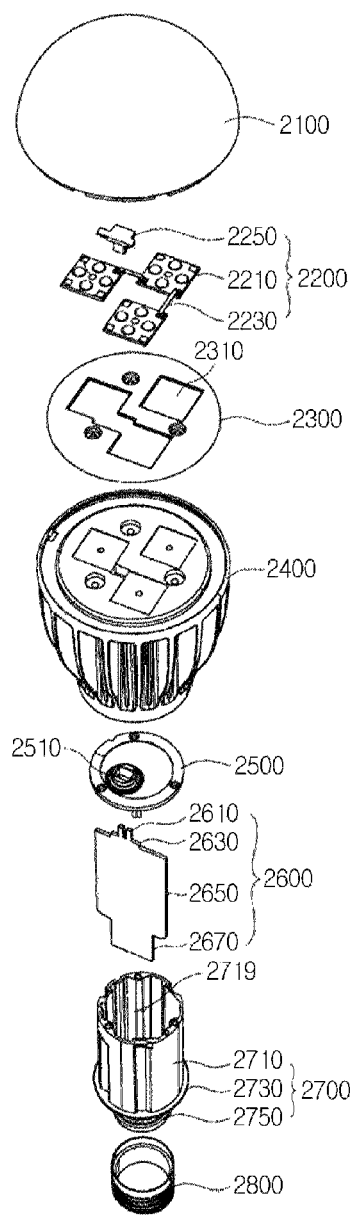
FIG. 15 is an exploded perspective view illustrating a lighting device including a light emitting device according to an embodiment.

FIG. 15 is an exploded perspective view illustrating a lighting device including a light emitting device according an embodiment.

Referring to FIG. 15, the lighting device according to the present invention includes a cover 2100, a light source module 2200, a heat radiator 2400, a power supply 2600, an inner case 2700 and a socket 2800. In addition, the lighting device according to the present invention may further include at least one of a member 2300 and a holder 2500. The light source module 2200 may include the light emitting device according to the embodiment.

For example, the cover 2100 may have a bulb or hemispherical shape, a hollow shape or an open portion. The cover 2100 may be optically bonded to the light source module 2200. For example, the cover 2100 diffuses, scatters or excites light emitted from the light source module 2200. The cover 2100 may be a type of optical member. The cover 2100 may be bonded to the heat radiator 2400. The cover 2100 may have a bonding portion bonded to the heat radiator 2400.

An inner surface of the cover 2100 may be coated with a milky coating material. The milky coating material may include a diffusion material for diffusing light. A surface roughness of an inner surface of the cover 2100 may be greater than that of an outer surface thereof. The reason for this is that light is sufficiently scattered and diffused from the light source module 2200 and is then discharged to the outside.

The cover 2100 may be formed of a material such as glass, plastic, polypropylene (PP), polyethylene (PE) or polycarbonate (PC). Of these, polycarbonate has high light resistance, heat resistance and strength. The cover 2100 may be transparent so that the light source module 2200 is visible from outside, or be non-transparent. The cover 2100 may be formed by blow molding.

The light source module 2200 may be disposed on a surface of the heat radiator 2400. Accordingly, heat is conducted from the light source module 2200 to the heat radiator 2400. The light source module 2200 may include a plurality of light emitting devices 2210, at least one connection plate 2230 and a connector 2250.

The member 2300 is disposed on an upper surface of the heat radiator 2400 and a plurality of guide grooves 2310 into which the light emitting devices 2210 and the connector 2250 are inserted. The guide groove 2310 corresponds to substrate of the light emitting device 2210 and the connector 2250.

A light-reflecting material is coated or applied onto a surface of the member 2300. For example, a white coating material is coated or applied onto the surface of the member 2300. The member 2300 reflects light, which is reflected to an inner surface of the cover 2100 and returns backs to the light source module 2200, toward the cover 2100. Accordingly, luminous efficacy of the lighting device according to the present invention is improved.

The member 2300 is for example formed of an insulating material. The connection plate 2230 of the light source module 2200 may include an electrically conductive material. Accordingly, the heat radiator 2400 may electrically contact the connection plate 2230. The member 2300 is formed of an insulating material and thereby prevents short circuit between the connection plate 2230 and the heat radiator 2400. The heat radiator 2400 receives heat from the light source module 2200 and the power supply 2600 and discharges the same.

The holder 2500 clogs an accommodation groove 2719 of an insulation portion 2710 of the inner case 2700. Accordingly, the power supply 2600 accommodated in the insulation portion 2710 of the inner case 2700 is sealed. The holder 2500 has a guide protrusion 2510. The guide protrusion 2510 may include a hole through which the protrusion 2610 of the power supply 2600 passes.

The power supply 2600 processes or converts an electrical signal supplied from the outside and supplies the same to the light source module 2200. The power supply 2600 is accommodated in the accommodation groove 2719 of the inner case 2700 and is sealed in the inner case 2700 through the holder 2500.

The power supply 2600 may include a protrusion 2610, a guide portion 2630, a base 2650 and a protrusion 2670.

The guide portion 2630 protrudes to the outside from a side of the base 2650. The guide portion 2630 may be inserted into the holder 2500. A plurality of elements may be disposed on a surface of the base 2650. The elements for example include DC power conversion supply systems converting alternating current supplied from an exterior power source into direct current, driving chips for controlling operation of the light source module 2200, and electrostatic discharge (ESD) protection devices for protecting the light source module 2200, but the disclosure is not limited thereto.

The protrusion 2670 protrudes to the outside from another side of the base 2650. The protrusion 2670 is inserted into the connection portion 2750 of the inner case 2700 and receives an electrical signal from the outside. For example, a size of the protrusion 2670 may be smaller than or equal to that of the connection portion 2750 of the inner case 2700. One terminal of each of a positive (+) wire and a negative (−) wire is electrically connected to the protrusion 2670 and the other terminal thereof is electrically connected to the socket 2800.

The inner case 2700 may include a molding portion in addition to the power supply 2600. The molding portion is an area formed by hardening a molding liquid and fixes the power supply 2600 to an inner area of the inner case 2700.

As apparent from the fore-going, in accordance with the light emitting device according to the embodiments, the anti-crack layer contacts electrically a lower part of the circumference of the light emitting structure, thus advantageously preventing peeling between the light emitting structure and the first electrode layer and/or the conductive substrate 110 when cutting the light emitting structure 140 on a chip basis.

In addition, the anti-crack layer is disposed on the boundary between chip units of light emitting structure and is cut together with the light emitting structure, thus preventing cracking caused by cutting.

In addition, the anti-crack layer prevents cracking and peeling upon cutting of the light emitting structure and supply power to the light emitting structure, thus advantageously preventing deterioration in luminous efficacy of the light emitting device.

In addition, the metal contact portions are disposed to pass through the transparent electrode layer, thus readily ohmic-contacting the light emitting structure.

In addition, the metal contact portions pass through the transparent electrode layer, thus advantageously discharging heat generated in the light emitting structure to the conductive substrate.

In addition, the metal contact portions directly contact the light emitting structure, thus advantageously reducing forward voltage (VF).

An area of the metal contact portion is smaller than an area of the transparent electrode layer, thus reducing blocking of traveling of light reflected by the metal reflective layer and improving luminous efficacy.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising:
   a conductive substrate;
   a first electrode layer disposed on the conductive substrate;
   a light emitting structure disposed on the first electrode layer, the light emitting structure including a first semiconductor layer, a second semiconductor layer, and an active layer disposed between the first semiconductor layer and the second semiconductor layer;
   a second electrode layer electrically connected to the second semiconductor layer; and
   an anti-crack layer disposed on a boundary on which the light emitting structure is segmented on a chip basis,
   wherein the anti-crack layer is disposed under the light emitting structure and comprises a metal material contacting the light emitting structure,
   wherein the anti-crack layer forms a closed area,
   wherein the anti-crack layer comprises at least one of Au, Be and an Au alloy, and
   wherein the anti-crack layer is flush with the first electrode layer.

2. The light emitting device according to claim 1, wherein the anti-crack layer is disposed on the circumference of the light emitting structure.

3. The light emitting device according to claim 1, wherein the anti-crack layer has a width of 30 μm to 70 μm.

4. The light emitting device according to claim 1, wherein the anti-crack layer has a multilayer structure.

5. The light emitting device according to claim 1, further comprising a window layer disposed between the first electrode layer and the first semiconductor layer to reduce a reflectivity difference therebetween,
   wherein the anti-crack layer contacts a lower part of the window layer.

6. The light emitting device according to claim 5, wherein the window layer comprises GaP, GaAsP or AlGaAs.

7. The light emitting device according to claim 5, wherein an area in which the window layer contacts the anti-crack layer is doped with a dopant having the same polarity as the first semiconductor layer.

8. The light emitting device according to claim 7, wherein the area in which the window layer contacts the anti-crack layer is doped with a p-type dopant.

9. The light emitting device according to claim 7, wherein a doping concentration is $5 \times 10^{18}/cm^3$ to $1 \times 10^{18}/cm^3$ when the area in which the window layer contacts the anti-crack layer is doped with Mg.

10. The light emitting device according to claim 7, wherein a doping concentration is $5 \times 10^{19}/cm^3$ to $1 \times 10^{19}/cm^3$ when the area in which the window layer contacts the anti-crack layer is doped with C.

11. A light emitting device comprising:
    a conductive substrate;
    a first electrode layer disposed on the conductive substrate;
    a light emitting structure disposed on the first electrode layer, the light emitting structure including a first semiconductor layer, a second semiconductor layer, and an active layer disposed between the first semiconductor layer and the second semiconductor layer;
    a second electrode layer electrically connected to the second semiconductor layer; and
    an anti-crack layer disposed on a boundary on which the light emitting structure is segmented on a chip basis,
    wherein the anti-crack layer is disposed under the light emitting structure and comprises a metal material contacting the light emitting structure, and
    the first electrode layer comprises:
      a transparent electrode layer disposed between the conductive substrate and the first semiconductor layer; and
      an ohmic layer comprising a plurality of metal contact portions passing through the transparent electrode layer,
      wherein each metal contact portion comprises AuBe.

12. The light emitting device according to claim 11, wherein a planar area of the transparent electrode layer is greater than a planar area of the metal contact portion.

13. The light emitting device according to claim 11, wherein the planar area of the metal contact portion is 10% to 25% with respect to the planar area of the transparent electrode layer.

14. The light emitting device according to claim 11, wherein a surface of the metal contact portion contacts the first semiconductor layer.

15. The light emitting device according to claim 11, wherein the anti-crack layer forms a closed area.

16. The light emitting device according to claim 11, wherein the anti-crack layer is flush with the first electrode layer.

17. The light emitting device according to claim 11, wherein the anti-crack layer is disposed on the circumference of the light emitting structure.

18. A light emitting device comprising:
    a conductive substrate;
    a first electrode layer disposed on the conductive substrate;
    a light emitting structure disposed on the first electrode layer, the light emitting structure including a first semiconductor layer, a second semiconductor layer, and an active layer disposed between the first semiconductor layer and the second semiconductor layer;
    a second electrode layer electrically connected to the second semiconductor layer; and
    an anti-crack layer disposed on a boundary on which the light emitting structure is segmented on a chip basis,
    wherein the anti-crack layer is disposed under the light emitting structure and comprises a metal material contacting the light emitting structure,
    wherein the anti-crack layer forms a closed area, and
    wherein the light emitting structure comprises AlGaInP or GaInP.

19. The light emitting device according to claim 18, further comprising a current blocking layer disposed under the light emitting structure such that at least one portion of the current blocking layer overlaps the second electrode layer in a vertical direction, the current blocking layer having a lower electrical conductivity than the first electrode layer.

* * * * *